(12) United States Patent
Kiss et al.

(10) Patent No.: US 9,325,356 B2
(45) Date of Patent: Apr. 26, 2016

(54) SINGLE-SIDEBAND TRANSMITTER USING CLASS-S AMPLIFIER

(71) Applicant: LSI Corporation, San Jose, CA (US)

(72) Inventors: Peter Kiss, Basking Ridge, NJ (US); Said E. Abdelli, Minneapolis, MN (US); Donald R. Laturell, Oak Hill, FL (US); James F. MacDonald, Mendota Heights, MN (US); Steven C. Pinault, Allentown, PA (US); Ross S. Wilson, Menlo Park, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 65 days.

(21) Appl. No.: 14/380,936

(22) PCT Filed: Mar. 15, 2013

(86) PCT No.: PCT/US2013/031892
§ 371 (c)(1),
(2) Date: Aug. 26, 2014

(87) PCT Pub. No.: WO2014/142943
PCT Pub. Date: Sep. 18, 2014

(65) Prior Publication Data
US 2016/0056848 A1    Feb. 25, 2016

(51) Int. Cl.
*H04B 1/04* (2006.01)
*H03C 1/60* (2006.01)
*H04B 1/68* (2006.01)
*H04L 27/02* (2006.01)
*H04L 27/06* (2006.01)

(52) U.S. Cl.
CPC ............... *H04B 1/0475* (2013.01); *H03C 1/60* (2013.01); *H04B 1/68* (2013.01); *H04L 27/02* (2013.01); *H04B 2001/0408* (2013.01); *H04L 27/06* (2013.01); *H04L 27/063* (2013.01)

(58) Field of Classification Search
CPC .......... H03C 1/60; H04B 1/68; H04B 1/0475; H04B 2001/0408; H04L 27/02; H04L 27/06
See application file for complete search history.

(56) References Cited

U.S. PATENT DOCUMENTS

2003/0232607 A1    12/2003    Le Bars et al.
2006/0199551 A1    9/2006    Thomas et al.

(Continued)

OTHER PUBLICATIONS

Napieralska et al., "Outphasing power amplifier design investigations for 2.5G and 3G standards," in European Microwave Conference, 2007, pp. 1181-1184, Oct. 9-12, 2007.*

(Continued)

*Primary Examiner* — Chieh M Fan
*Assistant Examiner* — Michelle M Koeth
(74) *Attorney, Agent, or Firm* — Suiter Swantz pc llo

(57) ABSTRACT

An SSB transmitter includes a digital-to-digital converter generating first and second real signal components as a function of a complex input signal supplied to the transmitter, and a digital Hilbert transformation module coupled with the digital-to-digital converter and operative to generate first and second transformed signals as a function of the first and second real signal components. The transmitter further includes first and second bit-stream generators operative to generate first and second analog signals as a function of the first and second transformed signals, respectively. The transmitter includes first and second amplifiers. The first amplifier is operative to generate a first amplified signal as a function of the first analog signal. The second amplifier is operative to generate a second amplified signal as a function of the second analog signal. An analog hybrid coupler is connected with the first and second amplifiers and operative to perform an analog Hilbert transformation.

20 Claims, 8 Drawing Sheets

(56) References Cited

U.S. PATENT DOCUMENTS

2006/0245514 A1\* 11/2006 Ota .................. H03C 1/60
375/270
2008/0007330 A1\* 1/2008 Klingberg ............ H03F 1/0288
330/124 R
2012/0047416 A1 2/2012 Oh et al.

OTHER PUBLICATIONS

F.J. Harris, et al., "Digital Receivers and Transmitters Using Polyphase Filter Banks for Wireless Communications," IEEE Transactions on Microwave Theory and Techniques, vol. 51, No. 4, pp. 1395-1412, Apr. 2003.
J. Arias, et al., "A 32-mW 320-MHz Continuous-Time Complex Delta-Sigma ADC for Multi-Mode Wireless-LAN Receivers," IEEE Journal of Solid-State Circuits, vol. 41, No. 2, pp. 339-351, Feb. 2006.
S. Jantzi, et al., "Quadrature Bandpass Delta-Sigma Modulation for Digital Radio," IEEE Journal of Solid-State Circuits, vol. 32, No. 12, pp. 1935-1950, Dec. 1997.
Cobham, "Application Note: RF Directional Couplers and 3dB Hybrids Overview," M/A-COM, M560, v2.00, pp. 1-10, Oct. 2004.

\* cited by examiner

SINGLE-SIDEBAND TRANSMITTER USING CLASS-S AMPLIFIER

CROSS-REFERENCE TO RELATED APPLICATION(S)

The present application is a national stage entry, under 35 U.S.C. §371, of PCT International Patent Application No. PCT/US2013/031892 filed on Mar. 15, 2013, the complete disclosure of which is expressly incorporated herein by reference in its entirety for all purposes.

BACKGROUND

Single-sideband (SSB) transmitters are well known in the art and broadly used in radio frequency (RF) communications systems. (See, e.g., Behzad Razavi, "RF Microelectronics," $2^{nd}$ ed., Prentice Hall, 2011, the disclosure of which is incorporated herein by reference in its entirety.) These SSB transmitters typically process band-limited and continuous-time signals, often considered "traditional" signals. Class-S power amplifiers, on the other hand, are typically driven by wideband and sampled-data digital bitstreams. The output of an ideal class-S amplifier converts the digital bitstream into an analog signal.

SUMMARY

Embodiments of the present invention provide an SSB transmitter architecture for use with class-S amplifiers which achieves beneficial image rejection without a need for costly filtering to suppress image components. Moreover, one or more embodiments of the invention provide an SSB transmitter configured to achieve double the bandwidth of standard real transmitter architectures by using signals below $F_S/2$ and signals above $F_S/2$ to transmit information, where $F_S$ is a sampling frequency.

In accordance with an embodiment of the invention, an SSB transmitter includes a digital-to-digital converter operative to receive a complex input signal supplied to the transmitter and to generate at least first and second real signal components corresponding thereto. The transmitter further includes a digital Hilbert transformation module coupled with the digital-to-digital converter. The digital Hilbert transformation module is operative to receive the first and second real signal components and to generate corresponding first and second transformed signals as a function thereof. The transmitter further includes first and second bit-stream generators coupled with the digital Hilbert transformation module. The first bit-stream generator is operative to receive the first transformed signal and to generate a first analog signal indicative thereof. The second bit-stream generator is operative to receive the second transformed signal and to generate a second analog signal indicative thereof. First and second amplifiers included in the transmitter are coupled with the first and second bit-stream generators, respectively. The first amplifier is operative to receive the first analog signal and to generate a first amplified signal as a function of the first analog signal. The second amplifier is operative to receive the second analog signal and to generate a second amplified signal as a function of the second analog signal. The transmitter further includes an analog hybrid coupler connected with the first and second amplifiers. The analog hybrid coupler is operative to perform an analog Hilbert transform.

In accordance with another embodiment, a method for achieving image rejection in an SSB transmitter without a need for costly filtering to suppress image components includes the steps of: generating at least first and second real signal components from a complex input signal supplied to the transmitter; performing a digital Hilbert transformation on each of the first and second real signal components to thereby generate, as a function thereof, first and second transformed signals, respectively; generating a first and second analog signals as a function of the first and second transformed signals, respectively; amplifying the first and second analog signals to generate first and second amplified signals, respectively, as a function thereof; and combining the first and second amplifier signal using an analog Hilbert transformation to generate an output signal in such a manner that an image component associated with at least one of the first and second real signal components is suppressed in power without a need for filtering to attenuate the image component.

Embodiments of the invention will become apparent from the following detailed description thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1:
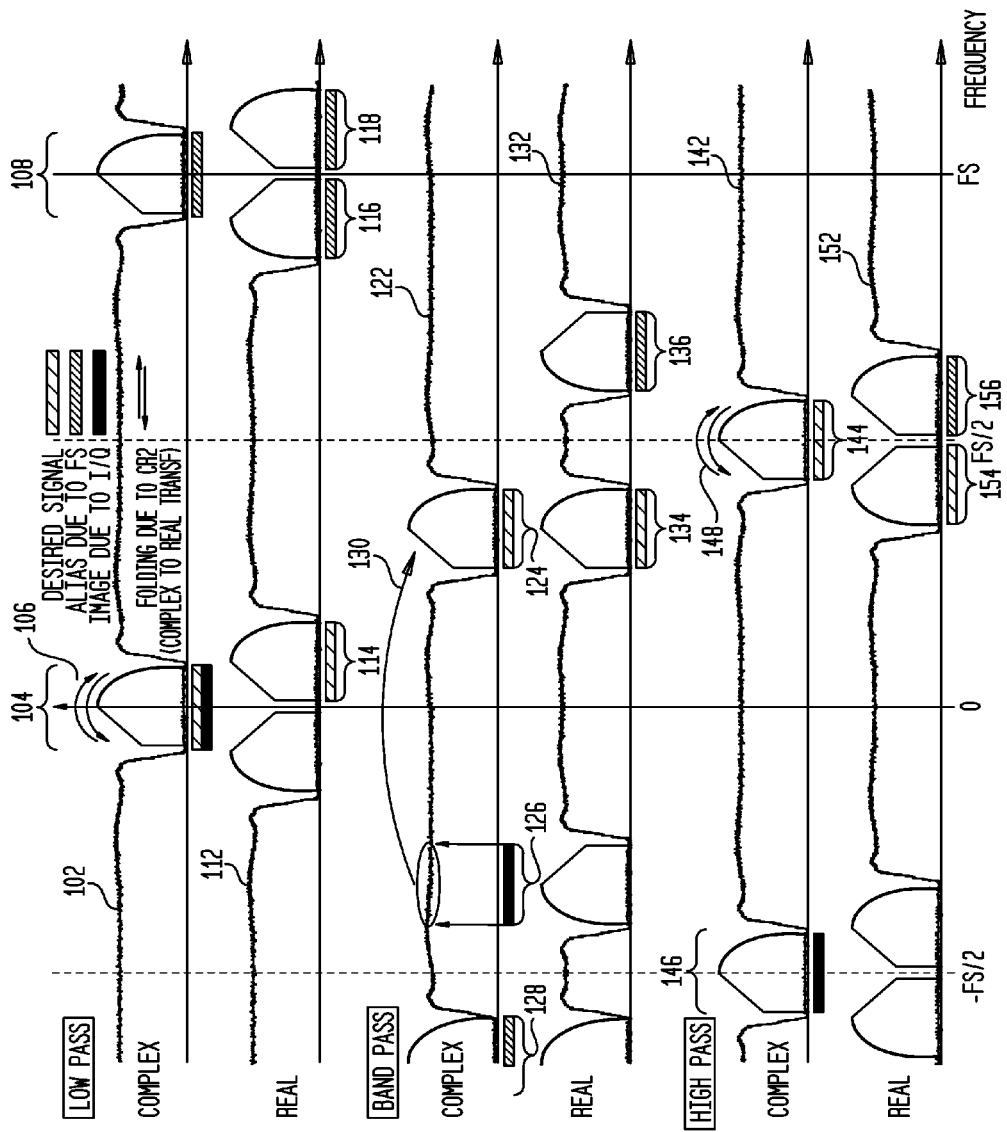
FIG. 1 conceptually depicts spectral folding attributable to a simple I+Q addition for exemplary low-pass, band-pass and high-pass complex signals, with corresponding signal waveforms for real class-S architectures shown for comparison.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Embodiments of the invention will be described herein in the context of an illustrative single-sideband (SSB) architecture for implementing class-S amplifiers which incorporates building blocks, such as, for example, digital Hilbert transforms, quadrature couplers, bit-stream generators and class-S power amplifiers. Furthermore, an extension of the novel architecture will be described which is suitable for frequency-agile communications, according to embodiments of the invention. It should be understood, however, that embodiments of the invention are not limited to these or any other particular SSB architectures. Rather, embodiments of the invention are more broadly related to providing an SSB architecture for class-S amplifiers which achieves beneficial image rejection without a need for costly filtering to suppress image components. Moreover, it will become apparent to those skilled in the art given the teachings herein that numerous modifications can be made to the illustrative embodiments shown that are within the scope of the claimed invention. That is, no limitations with respect to the embodiments shown and described herein are intended or should be inferred.

As a preliminary matter, for purposes of clarifying and describing embodiments of the invention, the following table provides a summary of certain acronyms and their corresponding definitions, as the terms are used herein:

Table of Acronym Definitions

| Acronym | Definition |
| --- | --- |
| SSB | Single-sideband |
| RF | Radio frequency |
| I/Q | In-phase/quadrature |
| $F_S$ | Sampling frequency |
| $F_C$ | Carrier frequency |
| D2D | Digital-to-digital |
| BSG | Bit-stream generator |
| PA | Power amplifier |
| ADC | analog-to-digital conversion/converter |

As a brief comparison between some properties of digital bit-streams compared to traditional analog signals, when sampling at RF frequencies, digital bit-streams are analog sampled-data signals subject to Nyquist sampling criteria, while traditional analog signals are continuous-time signals without alias components. With regard to quantization (e.g., single bit), digital bit-streams generally include wide-band spectral content with spread truncation error and traditional analog signals are band-limited by low-pass or band-pass filters. In a single-wire antenna context, digital bit-streams typically exhibit a truncation error spectrum that may fold in-band on a wide-band and sampled-data real signal, while traditional analog signals are band-limited and continuous time, so they can readily benefit from SSB techniques. Receivers usually maintain the down-converted signal as a complex (e.g., in-phase/quadrature (I/Q)) signal for use by a demodulator; transmitters require a real output signal. Therefore, several well-known complex receiver architectures are not suitable for use with transmitters generating real output signals.

The bit-streams can be generated via low-pass, band-pass or high-pass architectures using real (e.g., single-wire) or complex (e.g., two-wire) signals. From a bandwidth standpoint, the signal bandwidth of a complex architecture is twice the signal bandwidth of a real architecture. Accordingly, it is attractive to consider a complex architecture.

For a complex (I/Q) architecture, regardless of the specific methodology and architecture used to obtain the complex signal (e.g., complex mixing, complex modulator, etc.), a two-wire signal path in the transmitter must be re-combined to generate a single-wire real signal prior to being radiated by a single-wire antenna. When this re-combination is a simple addition (I+Q), then the I/Q images fold on top of each other and the complex spectrum collapses into a real spectrum. In this regard, the inherent bandwidth advantage of the complex architecture essentially vanishes, at least for a bit-stream application. In other words, a complex signal contains information in the full frequency spectrum, $0 \ldots F_S$, where $F_S$ represents a sampling frequency, while information contained in a real signal is limited to half the frequency spectrum, or $0 \ldots F_S/2$.

FIG. 1 conceptually depicts spectral folding attributable to a simple I+Q addition for exemplary low-pass, band-pass and high-pass complex signals, with corresponding signal waveforms for real class-S architectures shown for comparison. In the low-pass case, a complex signal waveform 102 exhibits a desired signal 104 centered around a frequency of zero. An image signal resulting from an I/Q modulation process will be present directly overlapping the desired signal 104 due to spectral folding 106 associated with a complex-to-real signal transformation. An alias signal component 108 is also present in waveform 102, with its energy centered around frequency $F_S$, as an artifact of the sampling process. By comparison, real signal waveform 112 exhibits a desired signal 114 as well as alias signal components, 116 and 118, resulting from the sampling process. No image components appear in waveform 112.

In the band-pass scenario, a complex waveform 122 depicts a desired signal 124 at a frequency below $F_S/2$, along with an image component 126 due to the I/Q modulation process. An alias signal component 128 is also present in waveform 122 due to sampling. Folding 130 of the image 126 onto the desired signal 124 will occur as a result of the complex-to-real signal transformation. By comparison, real signal waveform 132 exhibits a desired signal 134 as well as an alias signal component 136 due to the sampling process. As shown in FIG. 1, there are no image components appearing in the real signal waveform 132 in the frequency range of interest for the band-pass case.

For the high-pass case, a complex waveform 142 depicts a desired signal 144 at a frequency centered around $F_S/2$, along with an image component 146 due to the I/Q modulation process centered around $-F_S/2$. No alias signal components are present in waveform 142. Folding 148 of the image 146 onto the desired signal 144 will occur as a result of the complex-to-real signal transformation. By comparison, real signal waveform 152 exhibits a desired signal 154 as well as an alias signal component 156 due to the sampling process. There are no image components appearing in the real signal waveform 152 in the frequency range of interest for the high-pass case.

Embodiments of the invention depart from using a simple I+Q addition approach, and thereby avoid spectral folding. Rather, embodiments of the invention employ quadrature hybrid couplers as a primary means for re-combining the outputs of two or more class-S power amplifiers, as will be described in further detail herein below. One benefit of this approach is that it generates an SSB output for class-S power amplifiers, so it doubles the useful signal bandwidth when compared against traditional class-S power amplifiers.

Figure 2:
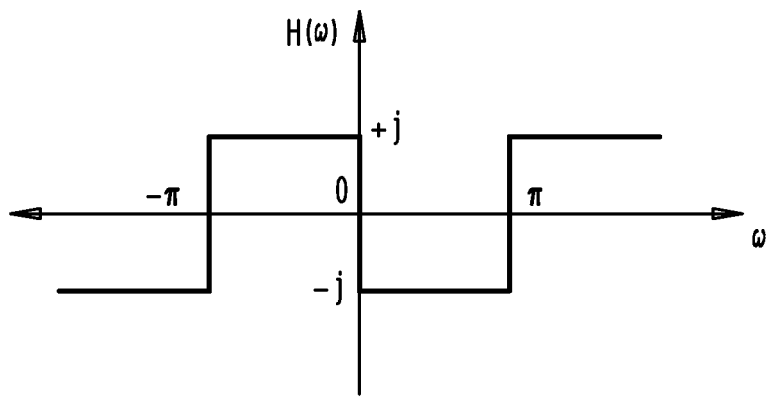
FIG. 2 graphically depicts a Hilbert transform.

The Fourier transform of a sampled real signal, $X(\omega)$, for positive frequencies, $0<\omega<\pi$ (or $0<f<F_S/2$), produces complex conjugate components, $X^*(\omega)$, for negative frequencies, $-\pi<\omega<0$ (or $-F_S/2<f<0$). The same complex conjugate components $X^*(\omega)$ appear above $\pi$ (or $F_S/2$) for $\pi<\omega<2\pi$ (or $F_S/2<f<F_S$). When this real signal $X(\omega)$ is passed through a digital Hilbert transform, $H(\omega)=+1$, for $-\pi<\omega<0$, $H(\omega)=0$ for $\omega=0$, and $H(\omega)=-j$, for $0<\omega<\pi$, then the digital Hilbert transform changes sign every $\pi$ radians (or $F_S/2$). With reference to FIG. 2, a Hilbert transform is graphically depicted.

A quadrature hybrid coupler, more broadly referred to as a directional hybrid coupler, also implements a Hilbert transform, but in the analog domain rather than the digital domain.

Figure 3:
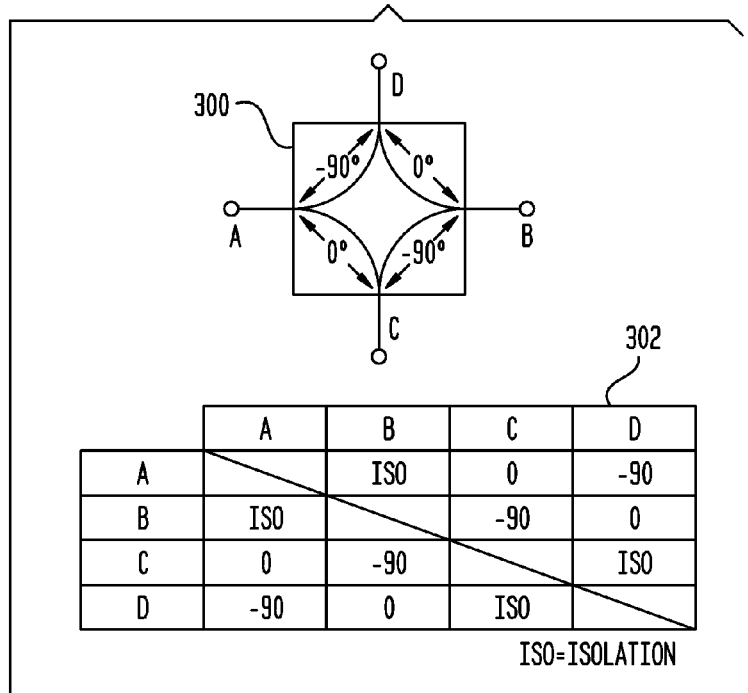
FIGS. 3 and 4 are circuit diagrams depicting exemplary 90-degree hybrid couplers and corresponding phase truth tables which are used to explain an operation of the hybrid coupler.
Figure 4:
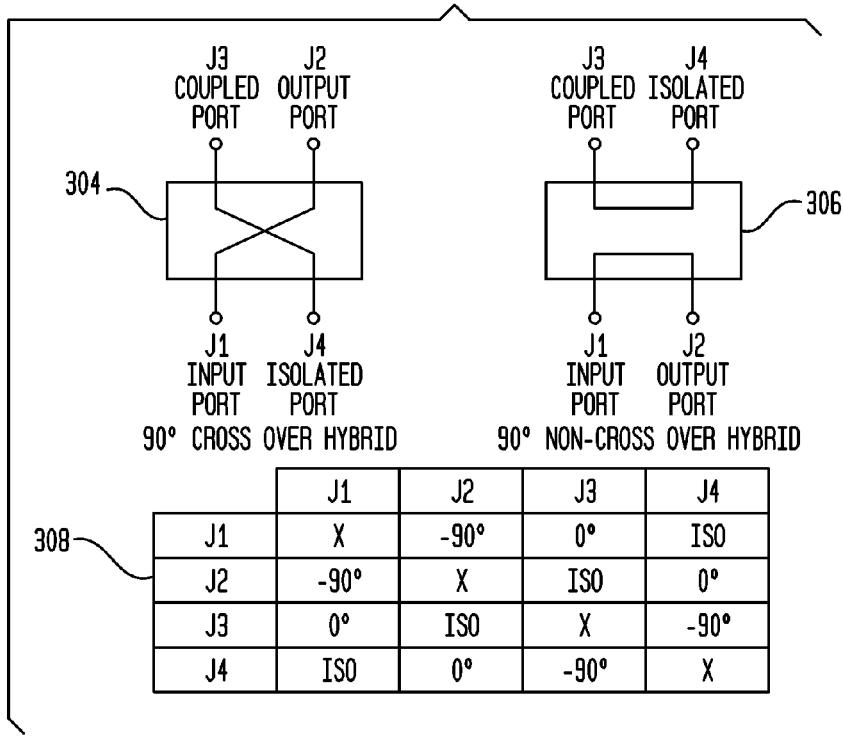

In contrast to a digital Hilbert transform, an analog Hilbert transform is continuous (i.e., it does not change sign) around π (or $F_S/2$). FIGS. 3 and 4 are circuit diagrams depicting exemplary RF 90-degree hybrid couplers and corresponding phase truth tables which are used to explain an operation of the hybrid coupler. With reference to FIG. 3, an illustrative hybrid coupler 300 includes four ports, A, B, C and D. The hybrid coupler 300 is, in this embodiment, a 90-degree hybrid, also referred to as a quadrature hybrid. A quadrature hybrid is electrically and mechanically symmetrical about both the x and y axes. Thus, when any one of the ports is fed by a signal source, two equal amplitude output signals that are 90 degrees out of phase with each other will result. Non-adjacent ports A and B of hybrid coupler 300 are electrically isolated; similarly, non-adjacent ports C and D are isolated. The phase relationships between ports A, B, C and D of the hybrid coupler 300 are shown in phase truth table 302.

FIG. 4 depicts schematic diagrams of two configurations of the quadrature hybrid 300 depicted in FIG. 3, along with a corresponding phase truth table. Specifically, a crossover hybrid configuration 304 and a non-crossover hybrid configuration 306 are shown. In each embodiment, four port functions are assigned, with J1 being designated as an input port, J2 being designated as an output port, J3 being designated as a coupled port, and J4 being designated as an isolated port. These ports may be arbitrarily assigned, but defining two of the ports essentially fixes the designations of the other two ports. A phase truth table 308, like the phase truth table 302 shown in FIG. 3, indicates the phase relationships between all ports for the two hybrid configurations 304, 306.

If a delayed version $X(\omega) \cdot H(\omega)$ and a straight (or non-delayed) version $X(\omega)$ of the sampled real signal $X(\omega)$ are combined with a quadrature hybrid coupler implementing an analog Hilbert transform, then image cancellation will occur in the combined signal, as will be described in further detail below in conjunction with FIGS. 5 and 6.

Figure 5:
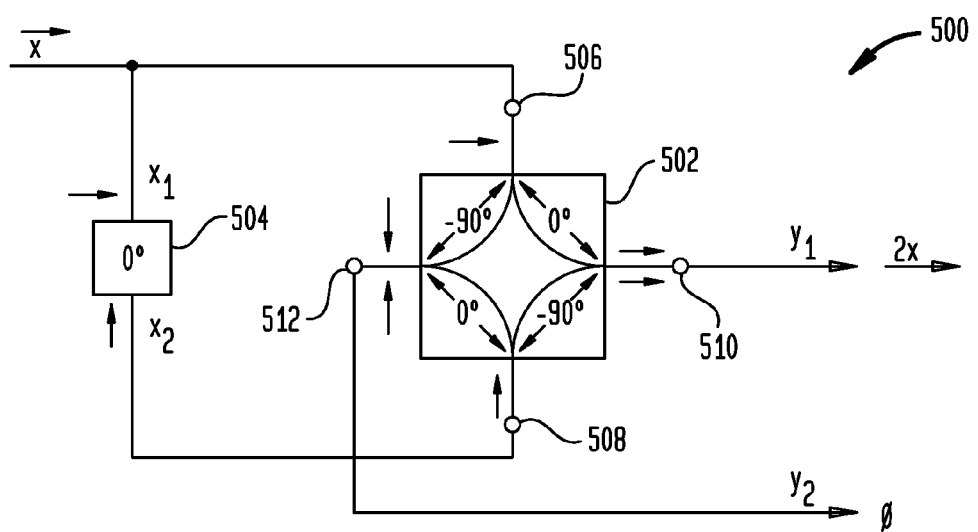
FIG. 5 is a block diagram depicting at least a portion of an image rejection architecture including time-domain phasor information, according to an embodiment of the invention.

FIG. 5 is a block diagram depicting at least a portion of an image rejection architecture 500 including time-domain phasor information, according to an embodiment of the invention. The image rejection architecture 500 comprises a quadrature hybrid coupler 502, implementing an analog Hilbert transform, and a delay block 504, implementing a 90-degree phase shift, coupled with the quadrature hybrid coupler. A sampled real signal, x, is supplied to an input of the image rejection architecture 500. A non-delayed (i.e., straight) version of input signal x, indicated as first signal $x_1$, is fed to a first port 506 of the quadrature hybrid coupler 502. The delay block 504, which has a 90-degree phase shift associated therewith, is operative to receive signal $x_1$ as an input, and to generate, as an output thereof, a delayed signal, $x_2$. The delayed signal $x_2$ is supplied to a second port 508 of the quadrature hybrid coupler 502. A third port 510 of the quadrature hybrid coupler 502 is operative to generate a first output signal, $y_1$, having an amplitude that is twice that of the input signal x (i.e., 2x). A fourth port 512 of the quadrature hybrid coupler 502 is operative to generate a second output signal, $y_2$, in which the signal x is beneficially suppressed (i.e., 0 or zero).

The phasor arrows appearing at various ports in the architecture 500 represent the relative phase relationship between the signals. When two replicas of the same signal have the same phases, then they constructively add (e.g., at port 510 of 502), and when two replicas of the same signal have opposite phases (180-degree relative phase difference), then they destructively add or cancel each other (e.g., at port 512 of 502).

Figure 6:
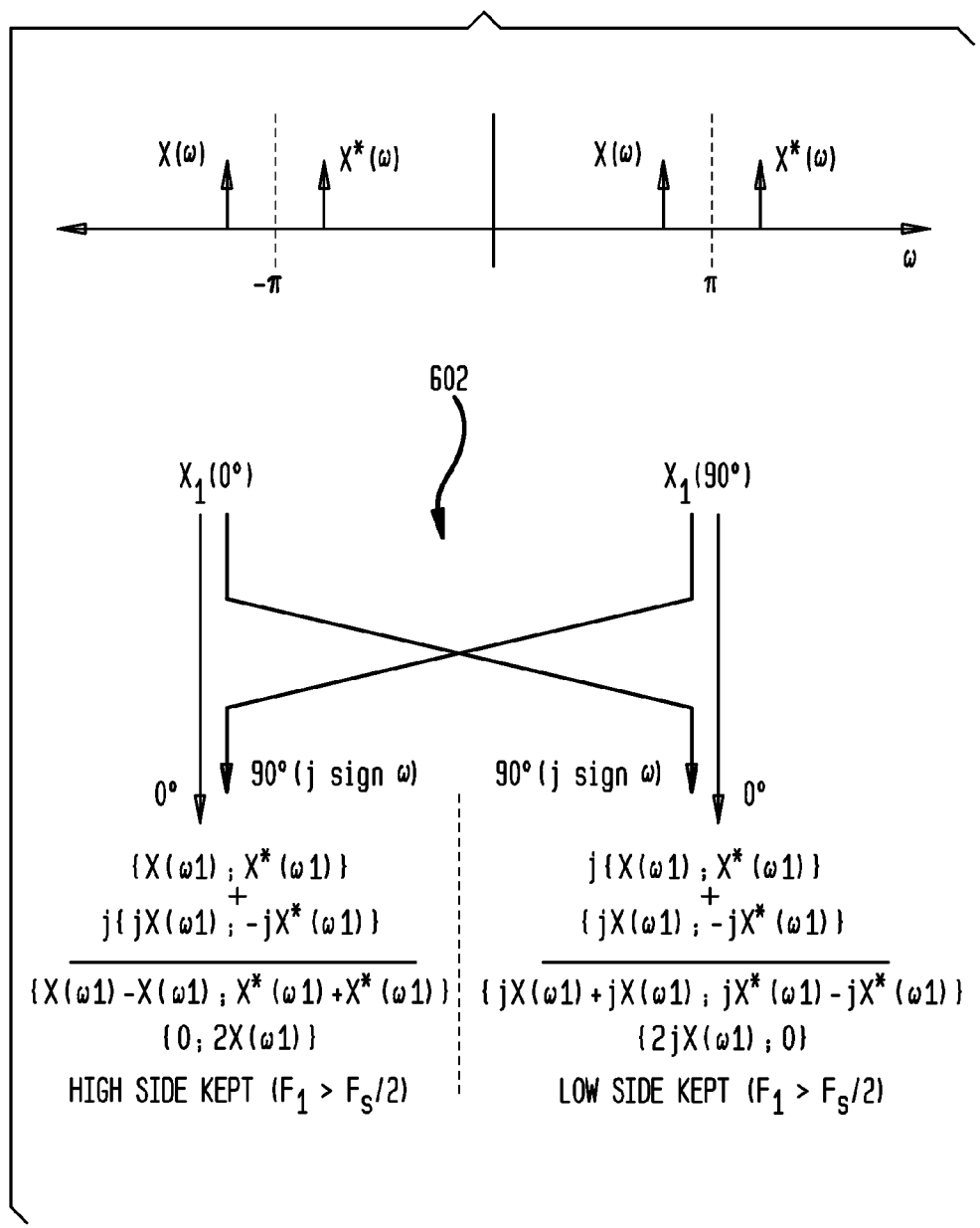
FIG. 6 conceptually depicts an exemplary frequency-domain analysis of the image rejection architecture shown in FIG. 5.

FIG. 6 conceptually depicts an exemplary frequency-domain analysis of the image rejection architecture 500 shown in FIG. 5. With reference to FIG. 6, note that $X(\omega)$ is a high-pass signal with its energy concentrated around π (or $F_S/2$); $X(\omega)$ below π and $X^*(\omega)$ above π. In the digital domain, a negative frequency component is also available, with its energy centered around $-\pi$ (or $-F_S/2$). The analog quadrature hybrid coupler adds 90 degrees to both the signal below $F_S/2$ and the signal above $F_S/2$ (since they are positive frequencies). The quadrature hybrid coupler, represented symbolically as 602, has a pass-band covering the bandwidth of $X(\omega)$ and $X^*(\omega)$.

Figure 7:
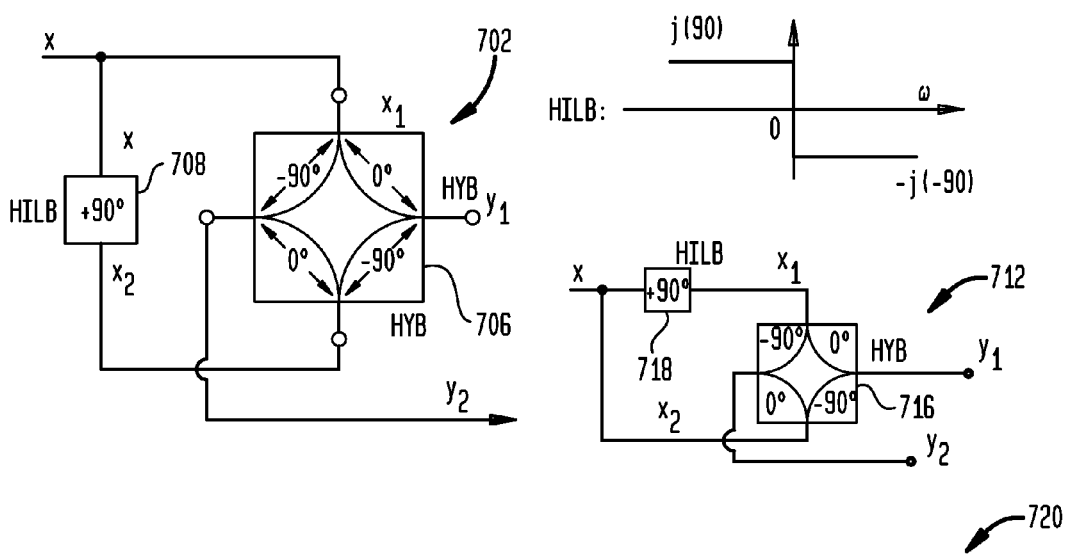
FIG. 7 are block diagrams depicting at least portions of exemplary image rejection architectures for high-side and low-side frequency components, according to an embodiment of the invention.

The illustrative image rejection architecture 500 shown in FIG. 5 can be reconfigured for both high-side (i.e., above $F_S/2$) and low-side (i.e., below $F_S/2$) frequency components, as shown in FIG. 7. Specifically, FIG. 7 are block diagrams depicting at least portions of exemplary image rejection architectures, 702 and 712, for high-side and low-side frequency components, according to an embodiment of the invention.

A first (high-side) image rejection architecture 702, which is implemented in a manner consistent with the image rejection architecture 500 shown in FIG. 5, includes a first quadrature hybrid coupler 706, implementing an analog Hilbert transform, and a first delay block 708 coupled with the first quadrature hybrid coupler. A non-delayed (i.e., straight) version of an input signal, x, supplied to an input of the image rejection architecture 702, indicated as first signal $x_1$, is fed to a first port of the quadrature hybrid coupler 706. The delay block 708, which has a 90-degree phase shift associated therewith, is operative to receive signal $x_1$ as an input, and to generate, as an output thereof, a delayed signal, $x_2$. The delayed signal $x_2$ is supplied to a second port of the quadrature hybrid coupler 706. A third port of the quadrature hybrid coupler 706 is operative to generate a first output signal, $y_1$, and a fourth port of the quadrature hybrid coupler 706 is operative to generate a second output signal, $y_2$. The first image rejection architecture 702 is configured such that high-side image components are suppressed (0 or zero) in signal $y_1$, low-side components in signal $y_1$ exhibit an amplitude that is twice that of the input signal x, high-side image components in signal $y_2$ exhibit an amplitude that is twice that of the input signal x, and low-side image components in signal $y_2$ are suppressed (0 or zero). This is shown in detail in the time-domain phasor analysis of table 720.

A second (low-side) image rejection architecture 712 comprises a second quadrature hybrid coupler 716, implementing an analog Hilbert transform, and a second delay block 718 coupled with the second quadrature hybrid coupler. Rather than placing the delay block in series with the second port of the quadrature hybrid coupler, as in the first image rejection architecture 702, the second delay block 718 is coupled in series with the first port of quadrature hybrid coupler 712. The delay block 718, which has a 90-degree phase shift associated therewith, is operative to receive an input signal, x, supplied to the second image rejection architecture 712, and to generate, as an output thereof, a delayed signal, $x_1$. The delayed signal $x_1$ is supplied to a first port of the quadrature hybrid coupler 716. A non-delayed (i.e., straight) version of an input signal, x, indicated as signal $x_2$, is fed to a second port of the quadrature hybrid coupler 716. A third port of the quadrature hybrid coupler 716 is operative to generate a first output signal, $y_1$, and a fourth port of the quadrature hybrid coupler 716 is operative to generate a second output signal, $y_2$. The second image rejection architecture 712 is configured such that low-side image components are suppressed (0 or zero) in signal $y_1$, high-side components in signal $y_1$ exhibit an amplitude that is twice that of the input signal x, low-side image components in signal $y_2$ exhibit an amplitude that is twice that of the input signal x, and high-side components in signal $y_2$ are suppressed (0 or zero). This is shown in detail in the time-domain phasor analysis of table 720.

Figure 8:
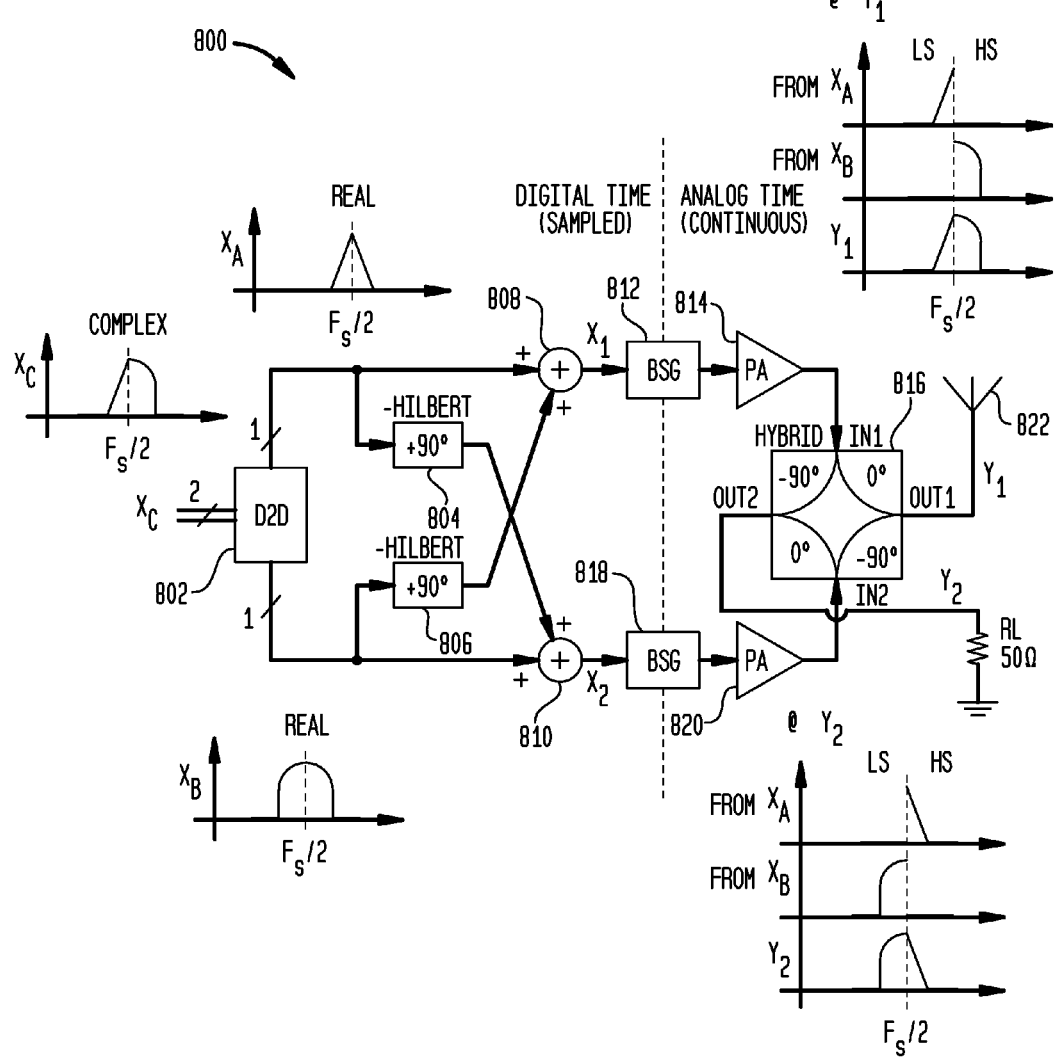
FIG. 8 is a block diagram depicting at least a portion of an SSB transmitter, according to an embodiment of the invention.

By combining the high-side image rejection architecture 702 and the low-side image rejection architecture 712 of FIG. 7, an SSB transmitter architecture can be constructed for class-S power amplifiers. By way of example only and without limitation, FIG. 8 is a block diagram depicting at least a portion of an exemplary SSB transmitter 800, according to an embodiment of the invention. The illustrative SSB transmitter architecture depicted in FIG. 8 is suitable for use in class-S power amplifier applications.

With reference to FIG. 8, the transmitter 800 includes a digital-to-digital (D2D) converter 802 operative to receive, as an input, a complex signal, $X_C$, supplied to the D2D converter, and to decompose the input signal $X_C$ into corresponding real signal components, $X_A$ and $X_B$. In this embodiment, spectral components of the complex signal $X_C$ above and below a prescribed frequency, $F_S/2$, are different. A low-side portion of signal $X_A$ (portion below $F_S/2$) generated by the D2D converter 802 is comprised of the spectral component of signal $X_C$ below $F_S/2$, and the high-side portion of signal $X_A$ (portion above $F_S/2$) is formed as a mirror image of its low-side spectral component. A high-side portion of signal $X_B$ generated by the D2D converter 802 is comprised of the spectral component of signal $X_C$ above $F_S/2$, and the low-side portion of signal $X_B$ is formed as a mirror image of its high-side spectral component.

Signals $X_A$ and $X_B$ are processed differently by corresponding digital Hilbert transformations, so their sums yield signals $X_1$ and $X_2$. More particularly, signal $X_A$ is fed to an input of a first digital Hilbert transform filter 804, and signal $X_B$ is fed to an input of a second digital Hilbert transform filter 806. Each of the Hilbert transform filters 804 and 806 is operative to perform a negative digital Hilbert transformation. A digital Hilbert transformation of the signal $X_B$ (using the second digital Hilbert transform filter 806) is summed with the signal $X_A$ using a first adder 808 to generate signal $X_1$. Similarly, a digital Hilbert transformation of the signal $X_A$ (using the first digital Hilbert transform filter 804) is summed with the signal $X_B$ using a second adder 810 to generate signal $X_1$. It is to be understood that alternative architectures for generating signals $X_1$ and $X_2$ are contemplated, according to other embodiments of the invention. Furthermore, it is to be appreciated that signals $X_1$ and $X_2$, as well as the signals preceding the adders 808, 810, are digital (i.e., sampled) signals, and thus the Hilbert transform filters 804, 806 are operative in the digital domain.

Digital signal $X_1$ generated by adder 808 is converted to an analog signal by a first bit-stream generator (BSG) 812, and is then fed to an input of a first power amplifier (PA) 814, which is preferably a class-S amplifier. An output of power amplifier 814 is supplied to a first port (IN1) of a quadrature hybrid coupler 816, or alternative directional coupler. Digital signal $X_2$ is supplied to a second bit-stream generator (BSG) 818, which is operative to convert signal $X_2$ to an analog signal, and is then fed to an input of a second power amplifier (PA) 820, which is preferably a class-S amplifier. An output of power amplifier 820 is supplied to a second port (IN2) of the quadrature hybrid coupler 816. It is to be appreciated that the signals on an output side of the bit-stream generators 812, 818 are analog (i.e., continuous) signals, and thus the quadrature hybrid coupler 816 is operative in the analog domain.

An antenna 822, or alternative signal radiating element, is connected with a third port (OUT1) of the quadrature hybrid coupler 816 and is operative to radiate a first output signal, $Y_1$, generated at the third port. The output signal $Y_1$ will essentially be a real analog signal representation of the complex digital input signal $X_C$ supplied to the transmitter 800. A fourth port (OUT2) of the quadrature hybrid coupler 816 is operative to generate a second output signal, $Y_2$, which is terminated to ground (or a prescribed voltage source) with a load resistor, RL, or alternative impedance element. In this embodiment, the load resistor RL is about 50 ohms, although embodiments of the invention are not limited to any specific resistance. The output signal $Y_2$ is essentially a mirror image of the output signal $Y_1$, with its energy centered around the frequency $F_S/2$.

One important benefit of the SSB transmitter architecture shown in FIG. 8 is that transmitter 800 is able to achieve double the bandwidth of standard real transmitter architectures by using signals below $F_S/2$ and signals above $F_S/2$ to transmit information. In contrast to transmitter 800, conventional real class-S power amplifier systems duplicate the signal as alias images, thus creating unwanted out-of-band emission which is difficult to filter. Consequently, bandwidth is typically wasted and less information is transmitted using standard class-S power amplifier architectures.

Figure 9:
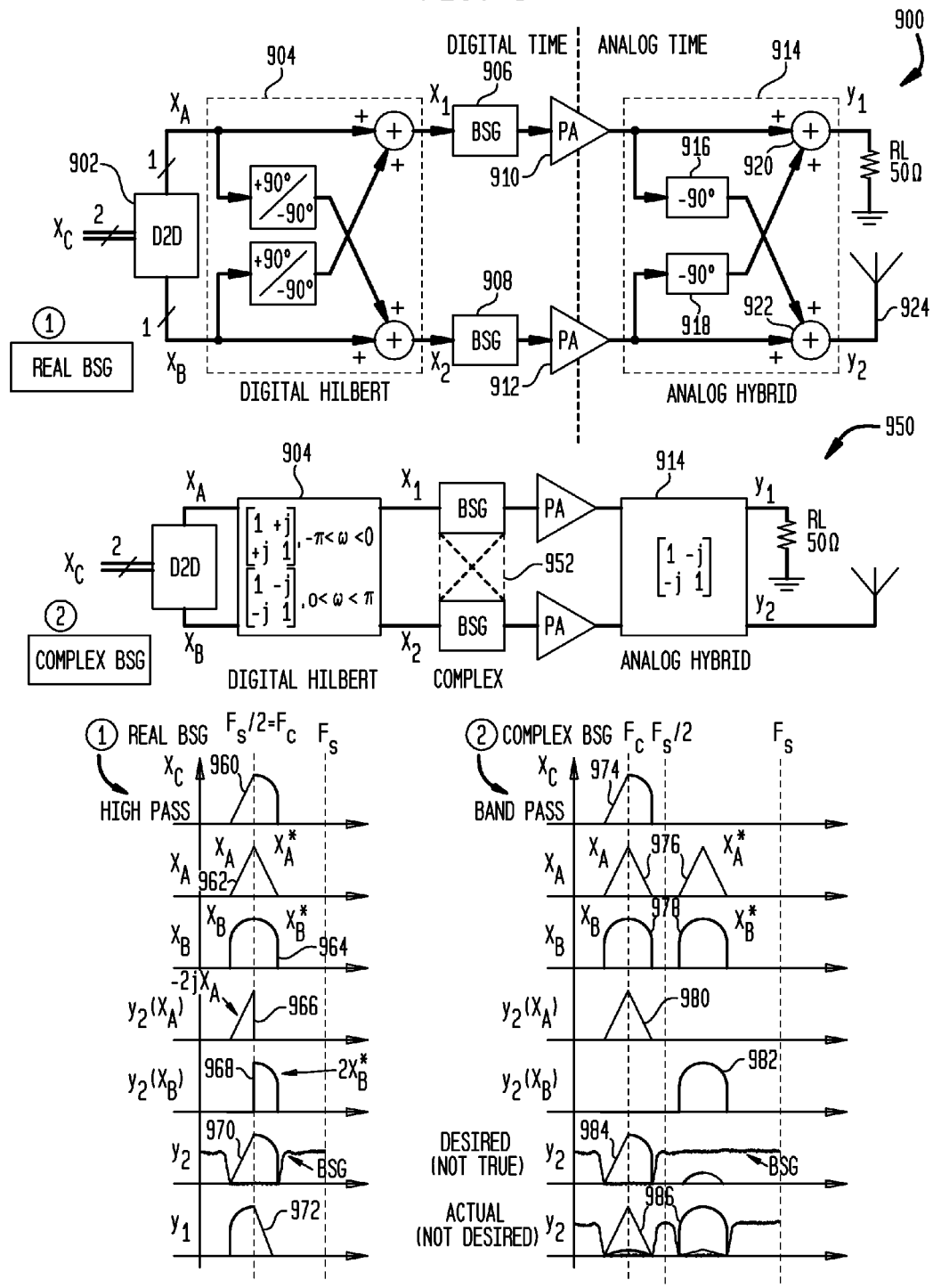
FIG. 9 are block diagrams depicting at least portions of exemplary SSB transmitter architectures for class-S power amplifiers, along with corresponding waveforms for the transmitter architectures, according to embodiments of the invention.

FIG. 9 are block diagrams depicting at least portions of exemplary SSB transmitter architectures for class-S power amplifiers, along with corresponding waveforms for the transmitter architectures, according to embodiments of the invention. Specifically, an SSB transmitter 900 includes a D2D converter 902 operative to receive, as an input, a complex signal, $X_C$, supplied to the D2D converter, and to decompose the input signal $X_C$ into corresponding real signal components, XA and XB. The D2D converter 902 can be implemented in a manner consistent with the D2D converter 802 shown in FIG. 8, although embodiments of the invention are not limited to any specific D2D converter implementation.

As in the exemplary SSB transmitter 800 shown in FIG. 8, signals $X_A$ and $X_B$ are processed differently by corresponding digital Hilbert transformations. In the transmitter architecture 900, signals $X_A$ and $X_B$ are fed to a digital Hilbert transformation block 904 and are processed in a manner consistent with the digital Hilbert transformation performed in the transmitter 800 depicted in FIG. 8 to generate summation signals $X_1$ and $X_2$. More particularly, signal $X_A$ is fed to an input of a first digital Hilbert transform filter, and signal $X_B$ is fed to an input of a second digital Hilbert transform filter. Each of the Hilbert transform filters is operative to perform a negative digital Hilbert transformation. A digital Hilbert transformation of the signal $X_B$ (using the second digital Hilbert transform filter) is summed with the signal $X_A$, using a first adder in the Hilbert transformation block 904, to generate signal $X_1$. Similarly, a digital Hilbert transformation of the signal $X_A$ (using the first digital Hilbert transform filter) is summed with the signal $X_B$ using a second adder in the Hilbert transformation block 904 to generate signal $X_2$. It is to be understood that alternative architectures for generating signals $X_1$ and $X_2$ are contemplated, according to other embodiments of the invention.

Signals $X_1$ and $X_2$ generated by the digital Hilbert transformation block 904 are fed to corresponding inputs of first and second real bit-stream generators (BSGs), 906 and 908, respectively. An output signal generated by bit-stream generator 906 is fed to an input of a first power amplifier (PA) 910. An output of the power amplifier 910 is supplied to a first port of an analog hybrid coupler 914, and an output of the power amplifier 912 is supplied to a second port of the analog hybrid coupler. In this embodiment, the analog hybrid coupler 914 is formed in a manner consistent with the digital Hilbert transformation block 904, except that the analog hybrid coupler comprises two analog negative Hilbert transform filters in place of the digital Hilbert transform filters used in Hilbert transformation block 904.

More particularly, Hilbert transformation block 914 comprises first and second analog Hilbert transform filters, 916 and 918, respectively. The output signal generated by power amplifier 910 is fed to an input of the first analog Hilbert transform filter 916, and the output signal generated by power amplifier 912 is fed to an input of the second analog Hilbert transform filter 918. A first adder 920 in the Hilbert transformation block 914 includes a first input adapted to receive an output signal generated by the second analog Hilbert transform filter 918, and a second input adapted to receive the output signal generated by power amplifier 910. Adder 920 is operative to generate a first output signal, $Y_1$, indicative of a summation of the output signal from the power amplifier 910 and the output signal from the second analog Hilbert transform filter 918. Similarly, a second adder 922 in the Hilbert transformation block 914 includes a first input adapted to receive an output signal generated by the first analog Hilbert transform filter 916, and a second input adapted to receive the output signal generated by power amplifier 912. Adder 922 is operative to generate a second output signal, $Y_2$, indicative of a summation of the output signal from the power amplifier 912 and the output signal from the first analog Hilbert transform filter 916. The output of adder 922 is coupled with an antenna 924, or alternative radiating element, for transmitting (e.g., radiating) the second output signal $Y_2$. The output of adder 920 is coupled with a load impedance, which in this embodiment is a load resistor, RL, having a resistance of about 50 ohms for efficient power transfer (through impedance matching) in typical RF transmission systems.

With the exemplary transmitter architectures 800 and 900 shown in FIGS. 8 and 9, respectively, the carrier frequency $F_C$ is set equal to one-half the sampling frequency (i.e., $F_C = F_S/2$). In some transmitter applications, however, it is desirable for the carrier frequency $F_C$ to be agile and easily programmable to meet varying carrier frequency requirements. Moreover, a complexity of the digital hardware can be beneficially reduced by making the sampling frequency $F_S$ an integer multiple (e.g., preferably a power of two) of the base-band sampling rate. Accordingly, embodiments of the invention can be extended to form a frequency-agile SSB transmitter 950 for class-S power amplifiers, which employs complex analog-to-digital conversion (ADC), as shown in FIG. 9 in matrix representation.

With continued reference to FIG. 9, SSB transmitter 950 is an alternative architecture of the SSB transmitter 900. Transmitter 950 is similar to the SSB transmitter 900, except that transmitter 950 comprises a complex bit-stream generator 952, rather than real bit-stream generators 906 and 908, which is preferably obtained by shifting high-pass bit-stream generators from $F_S/2$ to a lower (or higher) carrier frequency $F_C$ by interconnecting signal paths. Frequency shifting techniques, in the general sense, are well known by those skilled in the art in complex filters and in complex ADC applications. (See, e.g., J. Arias, P. Kiss, V. Prodanov, et al, "A 32-mW 320-MHz Continuous-Time Complex Delta-Sigma ADC for Multi-Mode Wireless-LAN Receivers," IEEE Journal of Solid-State Circuits, 2006, and S. Jantzi, K. Martin, A. Sedra, "Quadrature Bandpass Delta-sigma Modulation for Digital Radio," *IEEE Journal of Solid-State Circuits*, 1997, the disclosures of which are incorporated by reference herein in their entireties.) Embodiments of the invention extend these frequency shifting techniques to bit-stream generators.

Additionally, the digital Hilbert transformation block 904 and the analog hybrid coupler 914 are shown as matrix representations. It is to be understood that, in both transmitter architectures 900 and 950, signal $Y_2$ is the transmitted output signal, while in the SSB transmitter 800 shown in FIG. 8, signal $Y_1$ was the transmitted signal. The transmission of signal $Y_2$ in transmitters 900 and 950 of FIG. 9 enables a positive (i.e., regular) Hilbert transformation to be used, whereas in the illustrative transmitter 800 shown in FIG. 8, a negative Hilbert transform is required.

Waveforms 960 through 972 illustrate exemplary signals at several nodes corresponding to transmitter 900, while waveforms 974 through 986 illustrate exemplary signals at several nodes corresponding to transmitter 950. Specifically, in transmitter 900 which utilizes real bit-stream generators 906, 908, waveform 960 represents complex input signal $X_C$, which is a high pass signal having a carrier frequency, $F_C$, equal to $F_S/2$, where $F_S$ is the sampling frequency. Contrast this with transmitter 950 which utilizes complex bit-stream generators 952, where waveform 974 represents complex input signal $X_C$, which is a band pass signal having a carrier frequency $F_C$ that is below $F_S/2$. Thus, in the case of transmitter 900, signal components $X_A$ 962 and $X_B$ 964 will be centered around the carrier frequency $F_C = F_S/2$, whereas for transmitter 950, signal components $X_A$ 976 and $X_B$ 978 will exhibit complex conjugates centered around $F_S/2$.

With regard to the illustrative transmitter architectures 800 and 900 shown in FIGS. 8 and 9, respectively, it is noted that these architectures are similar. In transmitter architecture 800 depicted in FIG. 8, output signal $Y_1$ is the radiated signal and signal $Y_2$ is terminated. Conversely, in transmitter architecture 900 depicted in FIG. 9, output signal $Y_2$ is the radiated signal and signal $Y_1$ is terminated. Moreover, although the analog hybrid couplers 816 and 914 in FIGS. 8 and 9, respectively, are drawn differently, they are functionally the same. Furthermore, the exemplary signals 960, 962, 964, 966, 968, 970 and 972 depicted graphically in FIG. 9 are consistent with corresponding signals generated in the transmitter architecture 800 shown in FIG. 8, but with output signals $Y_1$ and $Y_2$ interchanged in the respective figures.

As for the exemplary transmitter architecture 950 also shown in FIG. 9, this transmitter architecture is consistent with the transmitter architecture 900, except for the implementation of the bitstream generators (906 and 908 in transmitter architecture 900, and 952 in transmitter architecture 900); bitstream generators 906, 908 in the transmitter architecture 900 are implemented using real bitstream generators, and bitstream generator 952 in the transmitter architecture 950 is implemented using a complex bitstream generator, as previously described.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this invention.

An integrated circuit in accordance with the present invention can be employed in essentially any application and/or electronic system in which high-speed switching (class-S)

amplifiers are utilized. Suitable systems for implementing techniques of the invention may include, but are not limited, to communication systems (wired and/or wireless), signal processors, power amplifiers (e.g., switching power amplifiers (SWPAs)), transmitters, receivers, signal generators, communication networks, etc. Systems incorporating such integrated circuits are considered part of this invention. Given the teachings of the invention provided herein, one of ordinary skill in the art will be able to contemplate other implementations and applications of the embodiments of the invention.

The illustrations of embodiments of the invention described herein are intended to provide a general understanding of the structure of various embodiments, and they are not intended to serve as a complete description of all the elements and features of apparatus and systems that might make use of the structures described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The abstract is provided to comply with 37 C.F.R. §1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A single side-band transmitter, comprising:
   a digital-to-digital converter operative to receive a complex input signal supplied to the transmitter and to generate at least first and second real signal components corresponding thereto;
   a digital Hilbert transformation module coupled with the digital-to-digital converter, the digital Hilbert transformation module being operative to receive the first and second real signal components and to generate corresponding first and second transformed signals as a function thereof;
   first and second bit-stream generators coupled with the digital Hilbert transformation module, the first bit-stream generator being operative to receive the first transformed signal and to generate a first analog signal indicative thereof, the second bit-stream generator being operative to receive the second transformed signal and to generate a second analog signal indicative thereof;
   first and second amplifiers coupled with the first and second bit-stream generators, respectively, the first amplifier being operative to receive the first analog signal and to generate a first amplified signal as a function of the first analog signal, the second amplifier being operative to receive the second analog signal and to generate a second amplified signal as a function of the second analog signal; and
   an analog hybrid coupler connected with the first and second amplifiers, the analog hybrid coupler being operative to perform an analog Hilbert transformation.

2. The transmitter of claim 1, wherein the digital Hilbert transformation module comprises:
   first and second digital Hilbert transform filters, each of the digital Hilbert transform filters being operative to perform a negative digital Hilbert transformation; and
   first and second adders, the first adder being configured to receive the first real signal component and an output of the second digital Hilbert transform filter and being operative to generate the first transformed signal, the second adder being configured to receive the second real signal component and an output of the first digital Hilbert transform filter and being operative to generate the second transformed signal.

3. The transmitter of claim 1, wherein the analog hybrid coupler comprises:
   first and second analog Hilbert transform filters, each of the analog Hilbert transform filters being operative to perform an analog Hilbert transformation; and
   first and second adders, the first adder being configured to receive the first amplified signal and an output of the second analog Hilbert transform filter and being operative to generate a first output signal, the second adder being configured to receive the second amplified signal and an output of the first analog Hilbert transform filter and being operative to generate a second output signal.

4. The transmitter of claim 3, wherein the second output signal is emitted by a signal radiating element, and the first output signal is terminated to a prescribed voltage source.

5. The transmitter of claim 1, wherein the analog hybrid coupler is configured to maintain a substantially ninety-degree phase difference between the first and second amplified signals.

6. The transmitter of claim 1, wherein the analog hybrid coupler comprises a quadrature hybrid coupler.

7. The transmitter of claim 1, wherein the digital-to-digital converter is configured to generate the first real signal component such that a low-side portion of the first real signal component is comprised of a spectral component of the complex input signal below $F_S/2$, where $F_S$ is a sampling frequency, and a high-side portion of the first real signal component is formed as a mirror image of the low-side portion of the first real signal component, and wherein the digital-to-digital converter is configured to generate the second real signal component such that a high-side portion of the second real signal component is comprised of a spectral component of a complex input signal above $F_S/2$, and a low-side portion of the second real signal component is formed as a mirror image of the high-side portion of the second real signal component.

8. The transmitter of claim 1, wherein each of the first and second amplifiers comprises a power amplifier.

9. The transmitter of claim 1, wherein at least a portion of the transmitter is fabricated in at least one integrated circuit.

10. An electronic system, comprising:
    at least one single-sideband transmitter, the at least one single-sideband transmitter comprising:
    a digital-to-digital converter operative to receive a complex input signal supplied to the transmitter and to generate at least first and second real signal components corresponding thereto;
    a digital Hilbert transformation module coupled with the digital-to-digital converter, the digital Hilbert transformation module being operative to receive the first and second real signal components and to generate corresponding first and second transformed signals as a function thereof;
    first and second bit-stream generators coupled with the digital Hilbert transformation module, the first bit-stream generator being operative to receive the first transformed signal and to generate a first analog signal indicative thereof, the second bit-stream generator being operative to receive the second transformed signal and to generate a second analog signal indicative thereof;
    first and second amplifiers coupled with the first and second bit-stream generators, respectively, the first amplifier being operative to receive the first analog signal and to generate a first amplified signal as a function of the first analog signal, the second amplifier being operative to receive the second analog signal and to generate a second amplified signal as a function of the second analog signal; and
    an analog hybrid coupler connected with the first and second amplifiers, the analog hybrid coupler being operative to perform an analog Hilbert transformation.

11. The system of claim 10, wherein the digital Hilbert transformation module in the at least one single-sideband transmitter comprises:
    first and second digital Hilbert transform filters, each of the digital Hilbert transform filters being operative to perform a negative digital Hilbert transformation; and
    first and second adders, the first adder being configured to receive the first real signal component and an output of the second digital Hilbert transform filter and being operative to generate the first transformed signal, the second adder being configured to receive the second real signal component and an output of the first digital Hilbert transform filter and being operative to generate the second transformed signal.

12. The system of claim 10, wherein the analog hybrid coupler in the single-sideband transmitter comprises:
    first and second analog Hilbert transform filters, each of the analog Hilbert transform filters being operative to perform an analog Hilbert transformation; and
    first and second adders, the first adder being configured to receive the first amplified signal and an output of the second analog Hilbert transform filter and being operative to generate a first output signal, the second adder being configured to receive the second amplified signal and an output of the first analog Hilbert transform filter and being operative to generate a second output signal.

13. The system of claim 12, wherein the at least one single-sideband transmitter includes a signal radiating element, and wherein the second output signal is emitted by the signal radiating element and the first output signal is terminated to a prescribed voltage source.

14. The system of claim 10, wherein the analog hybrid coupler in the at least one single-sideband transmitter is configured to maintain a substantially ninety-degree phase difference between the first and second amplified signals.

15. The system of claim 10, wherein the analog hybrid coupler in the at least one single-sideband transmitter comprises a quadrature hybrid coupler.

16. The system of claim 10, wherein the digital-to-digital converter in the at least one single-sideband transmitter is configured to generate the first real signal component such that a low-side portion of the first real signal component is comprised of a spectral component of the complex input signal below $F_S/2$, where $F_S$ is a sampling frequency, and a high-side portion of the first real signal component is formed as a mirror image of the low-side portion of the first real signal component, and wherein the digital-to-digital converter is configured to generate the second real signal component such that a high-side portion of the second real signal component is comprised of a spectral component of a complex input signal above $F_S/2$, and a low-side portion of the second real signal component is formed as a mirror image of the high-side portion of the second real signal component.

17. The system of claim 10, wherein each of the first and second amplifiers in the at least one single-sideband transmitter comprises a power amplifier.

18. A method for achieving image rejection in a single-sideband transmitter without a need for costly filtering to suppress image components, the method comprising steps of:
    generating at least first and second real signal components from a complex input signal supplied to the transmitter;
    performing a digital Hilbert transformation on each of the first and second real signal components to thereby generate, as a function thereof, first and second transformed signals, respectively;
    generating first and second analog signals as a function of the first and second transformed signals, respectively;
    amplifying the first and second analog signals to generate first and second amplified signals, respectively, as a function thereof; and
    combining the first and second amplified signals using an analog Hilbert transformation to generate an output signal in such a manner that an image component associated with at least one of the first and second real signal components is suppressed in power without a need for filtering to attenuate the image component.

19. The method of claim 18, wherein the step of generating a first and second analog signals comprises passing the first and second transformed signals through corresponding bit-stream generators to thereby generate the first and second analog signals, respectively.

20. The method of claim 18, wherein the step of combining the first and second amplified signals comprises passing the first and second amplified signals through an analog hybrid coupler configured to maintain a substantially ninety-degree phase difference between the first and second amplified signals.

* * * * *